US006329868B1

(12) United States Patent
Furman

(10) Patent No.: US 6,329,868 B1
(45) Date of Patent: Dec. 11, 2001

(54) CIRCUIT FOR COMPENSATING CURVATURE AND TEMPERATURE FUNCTION OF A BIPOLAR TRANSISTOR

(75) Inventor: Bruce Michael Furman, Palo Alto, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/569,970

(22) Filed: May 11, 2000

(51) Int. Cl.[7] .......... H03K 17/78
(52) U.S. Cl. .......... 327/513; 327/378
(58) Field of Search .......... 327/512, 513, 327/362, 378, 83, 138, 538

(56) References Cited

U.S. PATENT DOCUMENTS 4,061,959 * 12/1977 Ahmed .......... 323/313
4,313,082 * 1/1982 Neidorff .......... 327/513

* cited by examiner

*Primary Examiner*—Timothy P. Callahan
*Assistant Examiner*—Linh Nguyen
(74) *Attorney, Agent, or Firm*—Blakely Sokoloff Taylor & Zafman LLP

(57) ABSTRACT

Curvature in the temperature response of junction voltage of a diode or transistor is compensated by circuitry which offsets the curvature at temperatures below a reference temperature and at temperatures above a reference temperature. Two current sources are provided including a first current source of current proportional to absolute temperature (PTAT) less a current complimentary to absolute temperature (CTAT) and a second current source of PTAT plus beta times CTAT (PTAT+βCTAT). A first current path is connected between a first current path between two potential levels ($V_{cc}$ $G_{nd}$) including the first current source serially connected with first and second semiconductor junctions, a second current path between the two potential levels including the second current source serially connected with a first three terminal transistor including a control terminal, means coupling the voltage across the first and second semiconductor junction devices to the control terminal of the first transistor, a second three terminal transistor including a control terminal, and means coupling a voltage from the first transistor to the control terminal of the second transistor to control current through the second transistor.

18 Claims, 2 Drawing Sheets

IOUT= (PTAT−CTAT)*(PTAT−CTAT)/(PTAT+B * CTAT)
IF (PTAT − CTAT > 0 ), OTHERWISE IOUT=0

IOUT= (PTAT–CTAT)*(PTAT–CTAT)/(PTAT+B * CTAT)

CIRCUIT FOR COMPENSATING CURVATURE AND TEMPERATURE FUNCTION OF A BIPOLAR TRANSISTOR

BACKGROUND OF THE INVENTION

This invention relates generally to electronic circuits generally, and more particularly the invention relates to analog electronic circuits.

Analog circuits typically operate on linear or analog signals which represent real world phenomenon such as temperature, pressure, and sound and are continuously variable over a wide range of values. This is to be distinguished from digital signals which represent the "ones" and "zeros" of binary arithmetic.

In temperature sensor products, for example, a signal proportional to absolute temperature (PTAT) and a signal complimentary to absolute temperature (CTAT) are obtained and manipulated. The PTAT signal, or current, is generally developed by applying the voltage difference of two bipolar junctions (transistors or diodes) running at different current density across a resistor. The current through the bipolar junctions should be constant or exponential in temperature. The CTAT current is developed by applying the voltage from a single bipolar junction (transistor or diode) across a resistor.

The junction voltage of a bipolar diode or transistor, whose current is constant or an exponential function of temperature is almost linear in temperature. The non-linear portion of the temperature function is called the curvature. This negative linear temperature coefficient is useful in band gap references, temperature sensors and other products. In most cases, a strictly linear response with curvature canceled would be optimal.

The present invention is directed to canceling the curvature in the temperature function of a bipolar junction base-emitter voltage.

SUMMARY OF THE INVENTION

In accordance with the present invention, the curvature in the temperature function of a bipolar junction base emitter voltage is canceled by providing a circuit in which curvature is offset over an operating range.

More particularly, curvature for two quadrants (e.g. low temperature curvature and high temperature curvature) are combined to offset the non-linear portions of current versus temperature for the junction voltage. In one embodiment, one quadrant is provided by applying a first current source, PTAT−CTAT, through first and second serially connected diode connected transistors. A second current source, PTAT+ βCTAT, is applied through a third transistor, with the voltage across the first and second serially connected transistors connected to the control electrode (e.g. base or gate) of the third transistor. The voltage of the emitter (source) of the third transistor is the control electrode voltage minus the base-emitter (gate-source) voltage, which is then applied across the base-emitter (gate-source) of a fourth transistor. The circuit output is the current through the fourth transistor.

The other quadrant is provided by a similar circuit but with the first current source being CTAT−PTAT. The output currents of the two quadrants are combined to provide the curvature offsets in current.

The circuit can be implemented with either the bipolar transistors, or MOSFET transistors operating in subthreshold conduction.

The invention and objects and feature thereof will be more readily apparent when the following detailed description and dependent claims when taken with the drawings.

DETAILED DESCRIPTION OF ILLUSTRATIVE EMBODIMENTS

Circuitry in accordance with the present invention provides curvature offset for the junction voltage of a bipolar diode or transistor as a function of temperature. The output of the circuit is as follows:

$$Correction = \left(A\frac{(PTAT-CTAT)^2}{(PTAT+\beta CTAT)}\right) = A\frac{\left(\left(\frac{T}{T_0}\right)-\left(2-\frac{T}{T_0}\right)\right)^2}{\left(\left(\frac{T}{T_0}\right)+\beta\left(2-\frac{T}{T_0}\right)\right)} = \left(\frac{A}{\beta}\right)\frac{\left(\frac{T}{T_0}-1\right)^2}{\left(\left(\frac{T}{T_0}\right)\left(\frac{1-\beta}{\beta}\right)+1\right)}$$

The three constants A, $T_0$ and beta are chosen to fit the non-linear portion of the bipolar junction characteristic. For beta equals 1 this reduces to a parabola:

$$A\left(\frac{T}{T_0}-1\right)^2.$$

$T_0$ is typically chosen near room temperature so that the uncorrected circuit can be trimmed with no correction at room temperature.

Beta is chosen to fit the nonlinear characteristic of the junction to be corrected. A is an overall scaling factor. The invention works by using two single quadrant current multipliers to achieve two quadrant operation.

Figure 1:
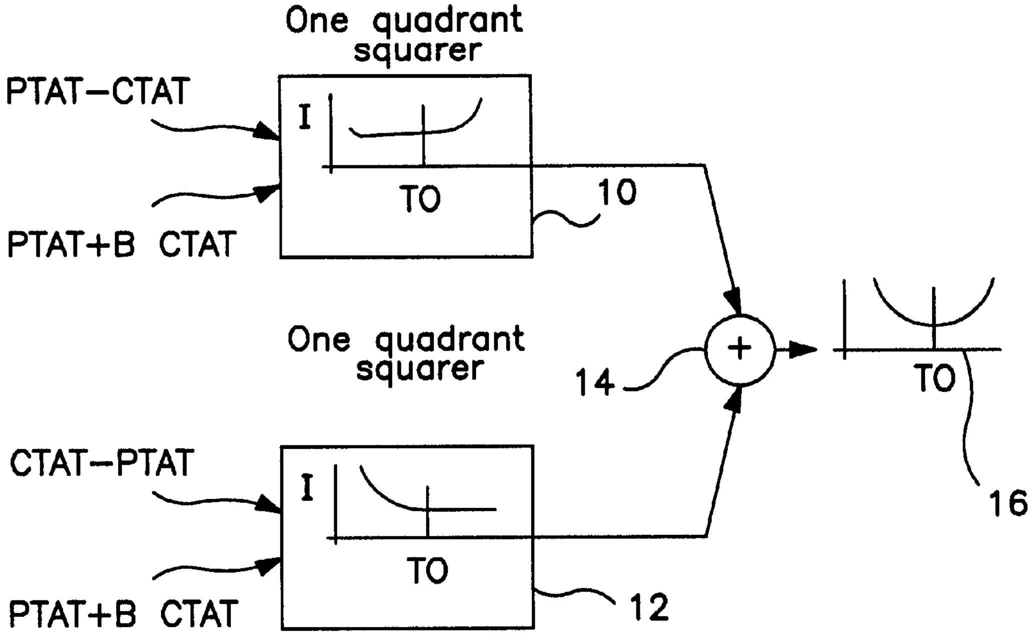
FIG. 1 illustrates curvature offset for two quadrants of a junction voltage versus temperature in accordance with the invention.

FIG. 1 illustrates curvature offset for two quadrants of a junction voltage versus temperature using the circuitry of the present invention. In this schematic, the difference in PTAT and CTAT currents is applied to two junctions connected in series from which is subtracted the junction potential from a device running at PTAT plus βCTAT current. The resultant potential is impressed across a fourth junction to generate the current such as illustrated at 10 and 12. For the curve in 10, the current difference is PTAT minus CTAT, while for the curve in 12 the current difference is CTAT minus PTAT, whereby the offsets to curvature occur both below and above a reference temperature $T_0$, (e.g., room temperature). The two currents from 10, 12 are summed at 14 to provide a combined current compensation as shown at 16.

Figure 2:
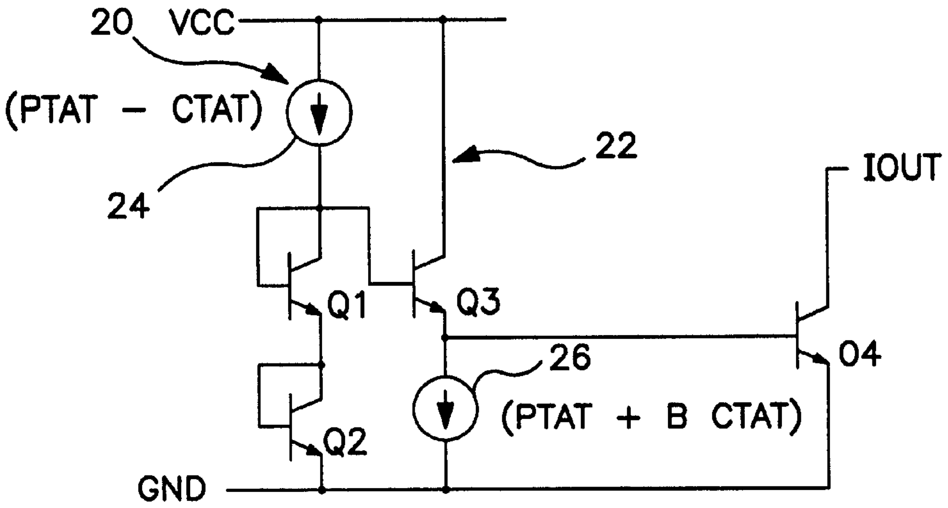
FIG. 2 is a schematic of a circuit for one quadrant offset in accordance with one embodiment of the invention.

Consider now the circuitry of FIG. 2 which generates the quadrant 10 of FIG. 1. The (PTAT−CTAT) current source 24 is connected through serially connected junction devices Q1, Q2 which are serially connected NPN bipolar transistors. The (PTAT+βCTAT) current source 26 is connected through NPN bipolar transistor Q3. The voltage across transistors Q1, Q2 is applied to be base of transistor Q3, and the voltage at the emitter of transistor Q3 (base voltage minus $V_{be}$) is applied to the base of transistor Q4. The current through transistor Q4 is the output, $I_{OUT}$ .

At temperature, $T_0$, PTAT equals CTAT and $I_{OUT}$ is zero. At temperature above, $T_0$, PTAT is larger than CTAT and produces an output current. At temperature below $T_0$ there is no output current.

Figure 3:
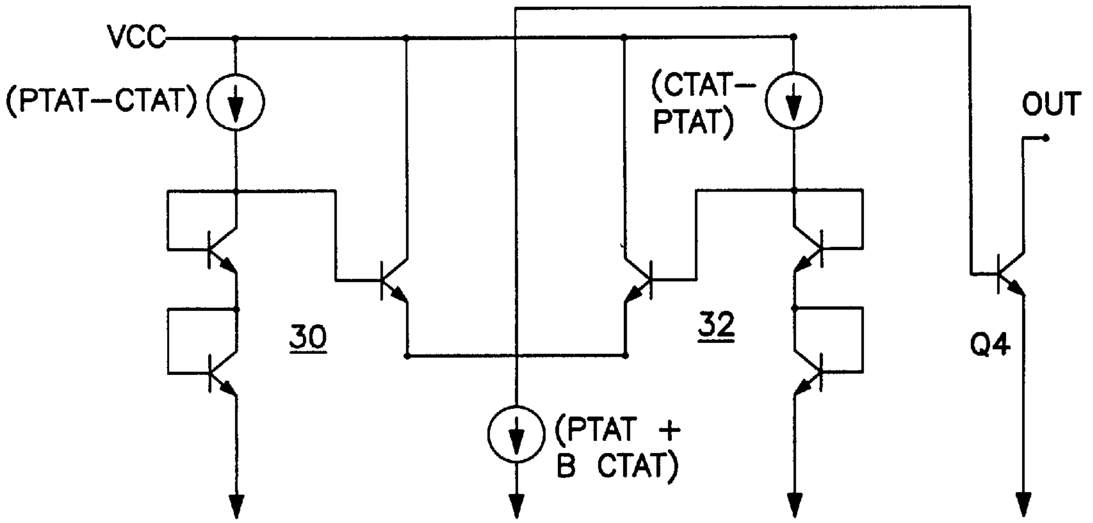
FIG. 3 is a schematic of two quadrant circuits of FIG. 2 combined to provide the temperature offset function of FIG. 1.

The circuit of FIG. 2 provides one quadrant (upper temperature) of the current compensation, and two circuits are combined to provide the compensation curve 16 of FIG. 1. FIG. 3 is a circuit for providing the two quadrant compensation and includes circuits 30, 32 which are equivalent to the circuit of FIG. 2 except that circuit 32 has the top current source reversed, or CTAT minus PTAT, to provide the low temperature current compensation. Circuits 30, 32 share a common current source 26 and a common transistor Q4 which is driven by the two circuits to provide a combined current output as shown at 16 in FIG. 1.

Figure 4:
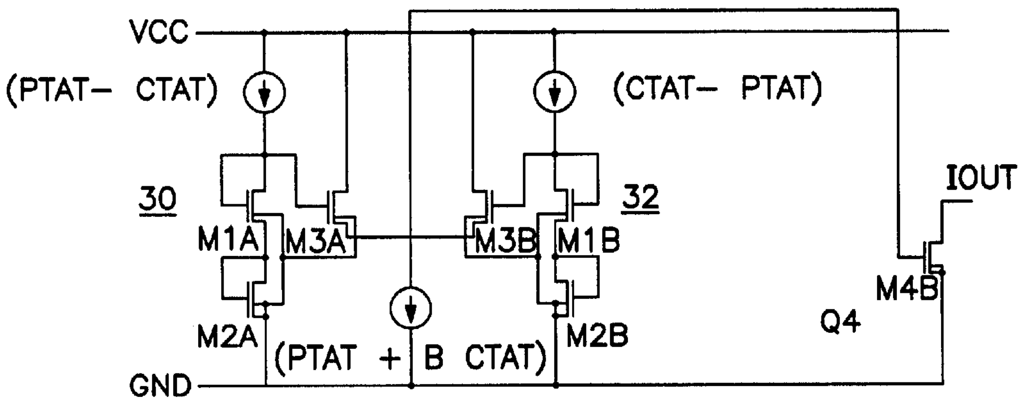
FIG. 4 is a schematic of the circuit of FIG. 3 but implemented with MOS transistors.

FIG. 4 is a circuit equivalent to FIG. 3 with the NPN bipolar transistors of FIG. 3 replaced by NMOS transistors operating in a subthreshold conduction range of operation.

The compensation of curvature in the temperature function of a bipolar junction base-emitter voltage in accordance with the invention improves the linearity of the response as required in temperature sensors and other temperature-related products. While the invention has been described with reference to specific embodiments, the description is illustrative of the invention and not to be construed as limiting the invention. Various modifications and applications may occur to those skilled in the art without departing from the true spirit and scope of the invention as defined by the appended claims.

What is claimed is:

1. A circuit for compensating for curvature in temperature response of junction voltage of a semiconductor device comprising:

a) a first current source of current proportional to absolute temperature through the device (PTAT) less a current complimentary to absolute temperature (CTAT), b) a second current source of PTAT plus a constant, β, times CTAT, c) a first current path between two potential levels ($V_{cc}$ $G_{nd}$) including the first current source serially connected with first and second semiconductor junction devices, d) a second current path between the two potential levels including the second current source serially connected with a first three terminal transistor including a control terminal, e) means coupling the voltage across the first and second semiconductor junction devices to the control terminal of the first transistor;

f) a second three terminal transistor including a control terminal, and g) means coupling a voltage from the first transistor to the control terminal of the second transistor to control current through the second transistor.

2. The circuit as defined by claim 1 wherein the first and the second semiconductor junctions comprise diodes.

3. The circuit as defined by claim 1 wherein the first and second semiconductor junctions comprise diode connected transistors.

4. The circuit as defined by claim 3 wherein the diode connected transistors comprise bipolar transistors with bases connected to collectors.

5. The circuit as defined by claim 4 wherein the first and second three terminal transistors comprise bipolar transistors.

6. The circuit as defined by claim 5 wherein all bipolar transistors are NPN.

7. The circuit as defined by claim 3 wherein the diode connected transistors comprise MOS transistors with gates connected to sources.

8. The circuit as defined by claim 7 wherein the first and second three terminal transistors comprise MOS transistors.

9. The circuit as defined by claim 8 wherein all MOS transistors are N channel.

10. A circuit for compensating for curvature in temperature response of junction voltage of a semiconductor device comprising, a) a first current source of current proportional to absolute temperature through the device (PTAT) less a current complimentary to absolute temperature (CTAT), b) a second current source of PTAT plus a constant, β, times CTAT, c) a first current path between two potential levels ($V_{cc}G_{nd}$) including the first current source serially connected with first and second semiconductor junction, d) a second current path between the two potential levels including the second current source serially connected with a first three terminal transistor including a control terminal, e) means coupling the voltage across the first and second semiconductor junction devices to the control terminal of the first transistor, f) a second three terminal transistor including a control terminal, g) means coupling a voltage from the first transistor to the control terminal of the second transistor to control current through the second transistor, h) a third current source of current complimentary to absolute temperature (CTAT) less current proportioned to absolute temperature (PTAT), and further including a second circuit comprising elements a) through f) with the third current source of current substituted for first current source in element a), and with element g) being shared.

11. The circuit as defined by claim 10 wherein the first and the second semiconductor junction comprise diodes.

12. The circuit as defined by claim 10 wherein the first and second semiconductor junctions comprise diode connected transistors.

13. The circuit as defined by claim 12 wherein the diode connected transistors comprise bipolar transistors with bases connected to collectors.

14. The circuit as defined by claim 13 wherein the first and second three terminal transistors comprise bipolar transistors.

15. The circuit as defined by claim 13 wherein all bipolar transistors are NPN.

16. The circuit as defined by claim 12 wherein the diode connected transistors comprise MOS transistors with gates connected to sources.

17. The circuit as defined by claim 16 wherein the first and second three terminal transistors comprise MOS transistors.

18. The circuit as defined by claim 17 wherein all MOS transistors are N channel.

* * * * *